(12) United States Patent
Ramappa

(10) Patent No.: US 7,868,306 B2
(45) Date of Patent: Jan. 11, 2011

(54) THERMAL MODULATION OF IMPLANT PROCESS

(75) Inventor: Deepak A. Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 292 days.

(21) Appl. No.: 12/243,992

(22) Filed: Oct. 2, 2008

(65) Prior Publication Data

US 2010/0084580 A1    Apr. 8, 2010

(51) Int. Cl.
*H01J 37/317* (2006.01)
*H01L 21/265* (2006.01)
(52) U.S. Cl. .............. 250/492.21; 250/492.2; 250/492.3; 250/443.1; 438/530
(58) Field of Classification Search ........... 250/492.21, 250/492.2, 492.3, 443.1; 438/530
See application file for complete search history.

(56) References Cited

U.S. PATENT DOCUMENTS

2008/0038908 A1* 2/2008 Henley ................... 438/530
2010/0084577 A1* 4/2010 Hatem et al. ............ 250/492.3

* cited by examiner

*Primary Examiner*—Nikita Wells

(57) ABSTRACT

A method for ion implantation is disclosed which includes modulating the temperature of the substrate during the implant process. This modulation affects the properties of the substrate, and can be used to minimize EOR defects, selectively segregate and diffuse out secondary dopants, maximize or minimize the amorphous region, and vary other semiconductor parameters. In one particular embodiment, a combination of temperature modulated ion implants are used. Ion implantation at higher temperatures is used in sequence with regular baseline processing and with ion implantation at cold temperatures. The temperature modulation could be at the beginning or at the end of the process to alleviate the detrimental secondary dopant effects.

21 Claims, 10 Drawing Sheets

THERMAL MODULATION OF IMPLANT PROCESS

BACKGROUND OF THE INVENTION

Ion implanters are commonly used in the production of semiconductor wafers. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

A block diagram of a representative ion implanter 100 is shown in FIG. 1. An ion source 110 generates ions of a desired species. In some embodiments, these species are atomic ions, which may be best suited for high implant energies. In other embodiments, these species are molecular ions, which may be better suited for low implant energies. These ions are formed into a beam, which then passes through a source filter 120. The source filter is preferably located near the ion source. The ions within the beam are accelerated/decelerated in column 130 to the desired energy level. A mass analyzer magnet 140, having an aperture 145, is used to remove unwanted components from the ion beam, resulting in an ion beam 150 having the desired energy and mass characteristics passing through resolving aperture 145.

In certain embodiments, the ion beam 150 is a spot beam. In this scenario, the ion beam passes through a scanner 160, which can be either an electrostatic or magnetic scanner, which deflects the ion beam 150 to produce a scanned beam 155-157. In certain embodiments, the scanner 160 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 1.

In an alternate embodiment, the ion beam 150 is a ribbon beam. In such an embodiment, there is no need for a scanner, so the ribbon beam is already properly shaped.

An angle corrector 170 is adapted to deflect the divergent ion beamlets 155-157 into a set of beamlets having substantially parallel trajectories. Preferably, the angle corrector 170 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 170, the scanned beam is targeted toward the workpiece 175. The workpiece is attached to a workpiece support. The workpiece support provides a variety of degrees of movement.

The workpiece support is used to both hold the wafer in position, and to orient the wafer so as to be properly implanted by the ion beam. To effectively hold the wafer in place, most workpiece supports typically use a circular surface on which the workpiece rests, known as a platen. Often, the platen uses electrostatic force to hold the workpiece in position. By creating a strong electrostatic force on the platen, also known as the electrostatic chuck, the workpiece or wafer can be held in place without any mechanical fastening devices. This minimizes contamination and also improves cycle time, since the wafer does not need to be unfastened after it has been implanted. These chucks typically use one of two types of force to hold the wafer in place: coulombic or Johnson-Rahbeck force.

The workpiece support typically is capable of moving the workpiece in one or more directions. For example, in ion implantation, the ion beam is typically a scanned or ribbon beam, having a width much greater than its height. Assume that the width of the beam is defined as the x axis, the height of the beam is defined as the y axis, and the path of travel of the beam is defined as the z axis. The width of the beam is typically wider than the workpiece, such that the workpiece does not have to be moved in the x direction. However, it is common to move the workpiece along the y axis to expose the entire workpiece to the beam.

Temperature, in particular, the temperature of the substrate onto which a particular ion or species is being implanted, plays an important role in ion implantation. While many ion implants are done at room temperature, there are benefits to performing implantation at other temperatures.

For example, low temperature implantation is known to reduce the number of end of range (EOR) defects. When ions are implanted into a substrate, they penetrate to a certain depth. Within this region, the implanted ions serve to change the normal crystalline structure of the substrate, such as silicon, into an amorphous structure. Those depths of the substrate that are not reached by the ions remain crystalline in structure. Therefore, there exists an interface between these two regions, known as the amorphous/crystalline interface. Near this interface, at the lower portion of the amorphous region, is an area that contains a higher density of interstitials. When the substrate is annealed after implantation to activate the dopant and to recrystallize this region, residual non-homogeneities cause residual defects. These defects are called the end of range (EOR) defects. These defects can take the form of dislocations and stacking faults.

These EOR defects, when present in the source or drain regions, cause junction leakage, which ultimately affects the performance of the final semiconductor component. As noted above, low temperature ion implantation has been shown to reduce the generation of EOR defects, thus improving component performance. This feature is especially important in ultrashallow junctions, where the depth of the source and drain regions is very small.

Alternatively, ion implanting or doping into substrates maintained at elevated temperatures (higher than room temperature) can also have benefits. Amorphization of crystalline materials that occurs with implant can be reduced. This may be preferable in applications where ions are being implanted into epitaxially grown substrates. Amorphization tends to destroy inherent properties of doped epi-substrates. Higher temperature implants are also beneficial when the implant dose is less than amorphization threshold. The overall residual damage in the substrate is reduced when such an implant is performed at elevated temperatures. For such low dose implants, heated implanted can also result in lower sheet resistance because of better dopant activation and reduced damage results in smaller amount of 'transient diffusion', which can degrade resistivity.

However, each of these temperature implantation modes also has disadvantages. A method of implantation which maximizes the advantages of each temperature implant, while minimizing the disadvantages would be very beneficial.

SUMMARY OF THE INVENTION

The problems of the prior art are overcome by the ion implantation method described in the present disclosure. The disclosure provides a method for ion implantation that includes modulating the temperature of the substrate during the process. This modulation affects the properties of the substrate, and can be used to minimize EOR defects, selectively segregate and diffuse out secondary dopants, maximize or minimize the amorphous region, and vary other semiconductor parameters. In one particular embodiment, a combination of temperature modulated ion implants are used. Ion implantation at higher temperatures is used in sequence with regular baseline processing and with ion implantation at cold temperatures. The temperature modulation could be at the beginning or at the end of the process to alleviate the detrimental secondary dopant effects.

DETAILED DESCRIPTION OF THE INVENTION

As stated above, temperature plays an important role in ion implantation. While many ion implants are done at or close to room temperature, there are benefits to performing implantation at high temperature or low temperature. For example, cryogenic ion implantation is beneficial in a number of applications, for example, in creating ultrashallow junctions in a crystalline silicon wafer. High temperature is useful when implanting germanium epilayers to reduce amorphization.

The present description discloses various embodiments in which the use of a plurality of temperatures during implant improves the quality and performance of the underlying semiconductor device. It is obvious to one skilled in the art that the following represents only a fraction of the possible uses of the disclosed method and other uses are contemplated and within the scope of the disclosure.

Ultrashallow junctions (USJ) are increasingly important in current semiconductor processing. Previously, atomic ions, such as $B^+$, were used to dope a region of a substrate. However, for shallow implantations, the required energy levels of the beam are lower. These lower energy level result in space-charge effects in the ion beam. To counteract these effects, heavier molecular ions are used, which do not penetrate the substrate as deeply due to the increased nuclear collisions with the lattice. Since higher energy levels can be used, space charge effects are minimized. Thus, instead of implanting an atomic ion such as B+, a molecular ion, such as $BF_2^+$, $BF_3^+$, CBH, $B_6H_{10}$ or $PH_3$, is used.

While these molecular ions indeed perform ionization at a more shallow level, there are several drawbacks. The use of these molecules leads to secondary dopants being implanted. For example, when $BF_2^+$ is implanted, this molecule can separate upon collision with the substrate, thereby creating secondary dopants, such as $BF^+$, $B^+$ and $F^-$. Similar results occur when other molecular ions are used. For example, $PH_3$ can create secondary ions that include $H^-$. These secondary dopants can have detrimental effects. For example, fluorine, which is highly reactive, corrodes contact metals. In other cases, fluorine and hydrogen form complexes that reduce the activation efficiency of the desired dopant. Additionally, fluorine and hydrogen play a role in the strain relaxation of the junction. Specifically, when a SiGe source/drain is implanted with $BF_2$, it will lose strain as a result of the amorphization and the incorporation of fluorine ions. Finally, because of the competition between the desired dopants and the secondary dopants, such as fluorine and hydrogen, the segregation and diffusion tendencies are altered. This, in some cases, leads to higher resistivity.

Figure 1:
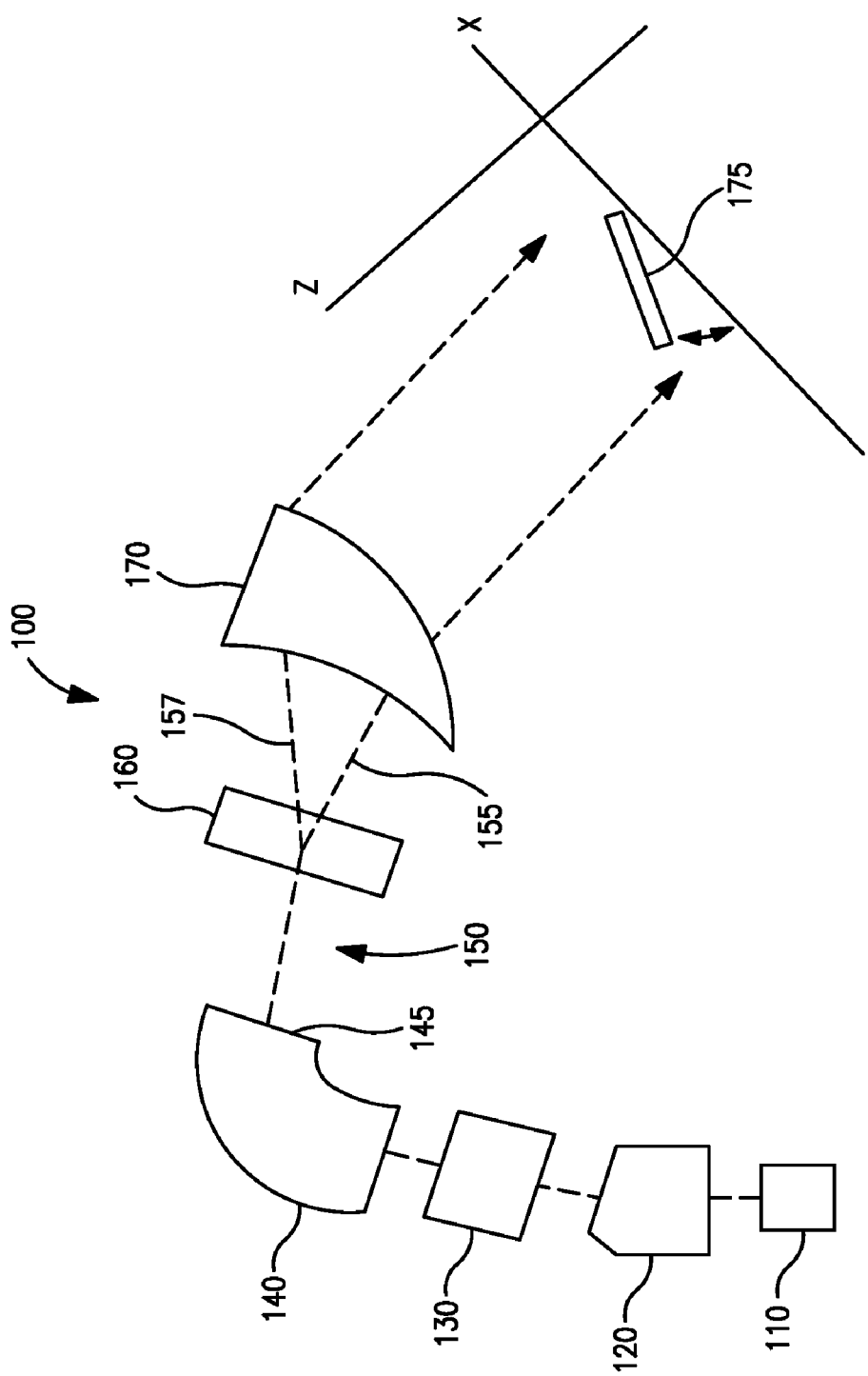
FIG. 1 represents a traditional ion implanter.
Figure 2:
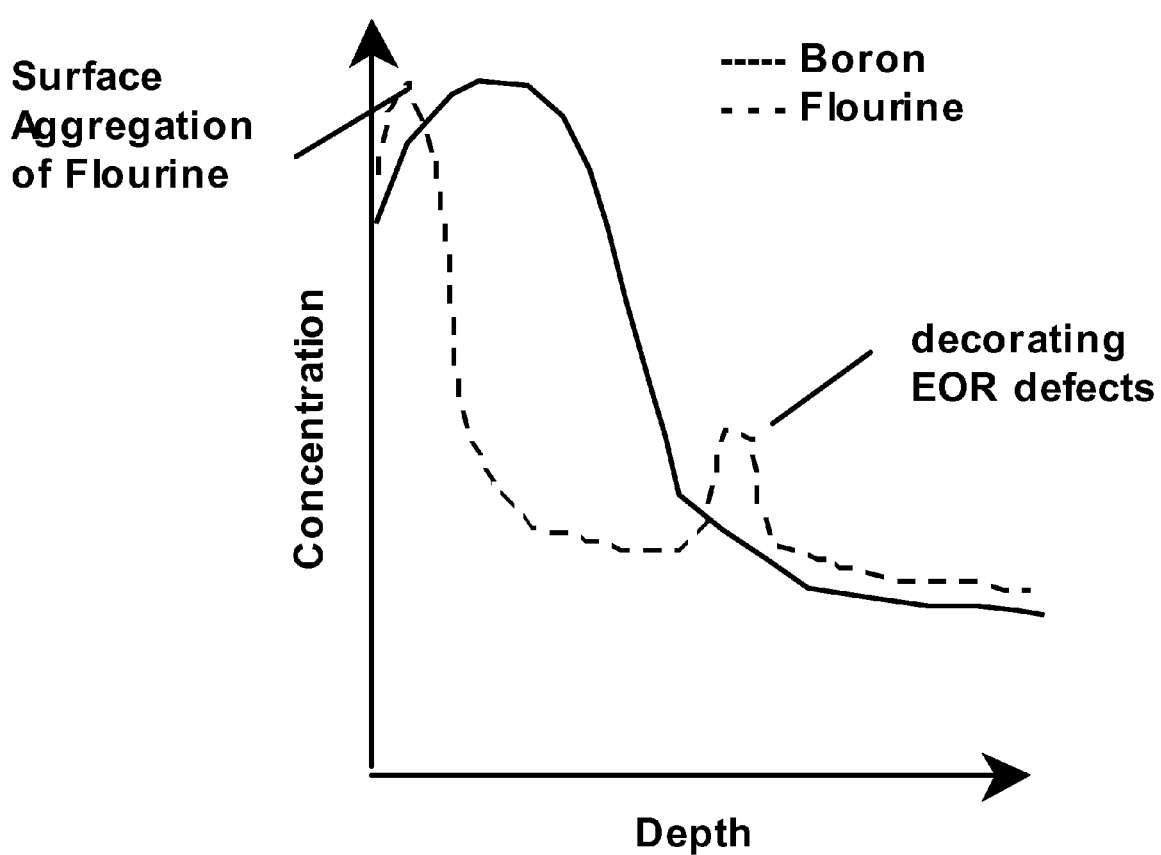
FIG. 2 represents a graph showing ion concentrations after $BF_2$ has been implanted into a substrate.

The effects of these secondary dopants are illustrated in FIG. 2. In this Figure, a substrate has been implanted with $BF_2^+$. As the molecular ions collide with the structure within the substrate, the molecular ions break down as described above. This graph shows the two key dopants that result from this implantation, boron and fluorine. The vertical axis signifies the concentration of each dopant, while the horizontal axis signifies the depth within the substrate. In other words, the y-axis represents the top surface of the substrate, and the substrate depth increases moving right along the x-axis. This graph has two lines; the first solid line represents the desired dopant, boron. As is expected, the concentration of boron approximates a bell shaped curve with its peak below the top surface of the substrate. The second dashed line represents the secondary dopant, fluorine. Unlike boron, the fluorine ions are concentrated in two specific areas. At the upper left of the graph, a first spike in fluorine concentration occurs near the surface of the substrate, where there are known to be many defects in the crystalline structure of the silicon. The second peak occurs much deeper in the substrate. This peak corresponds to the region where EOR defects are found in the substrate. In this case, the fluorine ions are said to "decorate" the EOR defect. The fluorine ions are attracted to these locations due to the number of defects in the structure, which creates more interstitials, which the fluorine ions then occupy.

As described above, cold ion implantation is known to reduce the occurrence of EOR defects and is commonly used for USJ fabrication. At the colder temperature, such as less than 0° C., and preferably between −10° C. and −100° C., the amorphization quality and thickness improves and therefore EOR defects are reduced.

Figure 3:
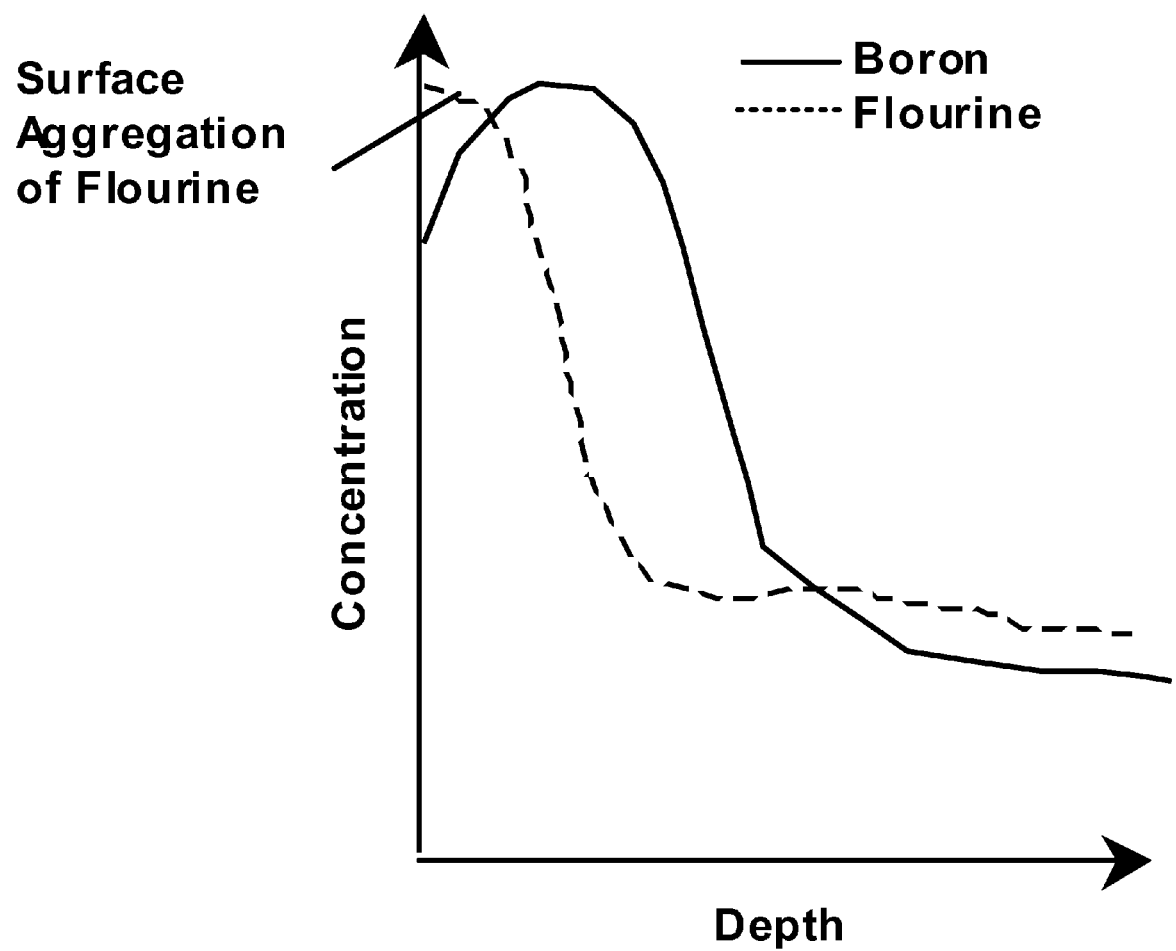
FIG. 3 represents a graph showing ion concentrations after $BF_2$ has been implanted into a substrate at cold temperature.

FIG. 3 shows the concentration of boron and fluorine ions in a substrate following cold ion implantation. Note that the boron concentration curve is unaffected by the change in temperature. However, the fluorine ion distribution has been greatly affected. As expected, there are few fluorine ions located deep within the substrate, as the EOR defects have been nearly eliminated by the cold temperature implant. This reduces device leakage, which is very advantageous. However, the concentration of fluorine ions near the surface of the substrate increased significantly. Since the fluorine ions are attracted to defects in the substrate, they now aggregate at the surface, since this is the location having the greatest number of defects.

Unfortunately, fluorine, especially at or near the surface of the substrate is detrimental to metal contact integration during the integrated circuit fabrication sequence. Since fluorine is highly corrosive, it corrodes the contact metals. Therefore, while the cold implant increased the device performance, it adversely affected the device reliability. Furthermore, the corrosion of metals by the fluorine leads to an increase in the resistance of the metals, which also degrades device performance.

Figure 4:
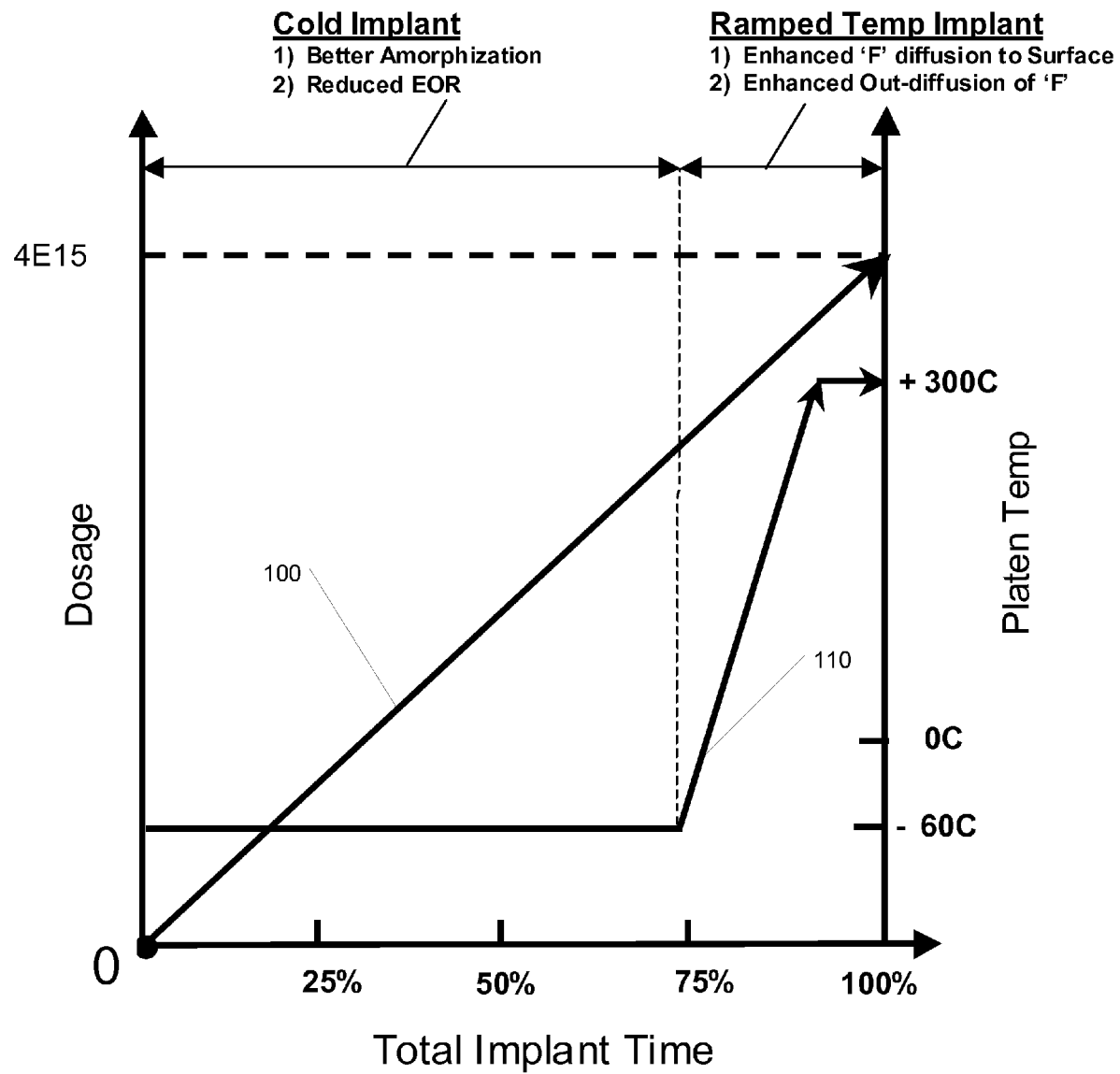
FIG. 4 represents an exemplary temperature profile that can be used according to one embodiment.

In one embodiment, the temperature at which the ion implantation is performed is changed from low to high during the process. FIG. 4 represents a graph showing dosage, implant time and temperature. Line 100 represents the total dosage applied to the substrate. Line 110 represents the temperature of the platen during the implant, which indirectly controls the temperature of the substrate itself. The vertical axis on the right shows the temperature scale used in this embodiment. In this embodiment, the platen, and therefore the substrate, are cooled to a sufficiently cold temperature, such as −60° C. A portion of the ion implant process is then performed at this temperature. As described above, this temperature improves the amorphization of the substrate and minimizes the number of EOR defects. At a point in the process, such as 75% complete, the temperature of the platen, and therefore the substrate, is increased to a higher temperature, such as 300° C. At this temperature, the trapped fluorine ions, which aggregated at the surface, are able to diffuse out of the substrate and into the ambient environment, thereby significantly reducing the fluorine remaining within the substrate. While FIG. 4 shows a higher temperature of 300° C., this is not a requirement of the disclosure. For example, gasses, such as hydrogen and fluorine, show enhanced diffusion at temperature much lower than 300° C., such as 100° C. or less.

Figure 5:
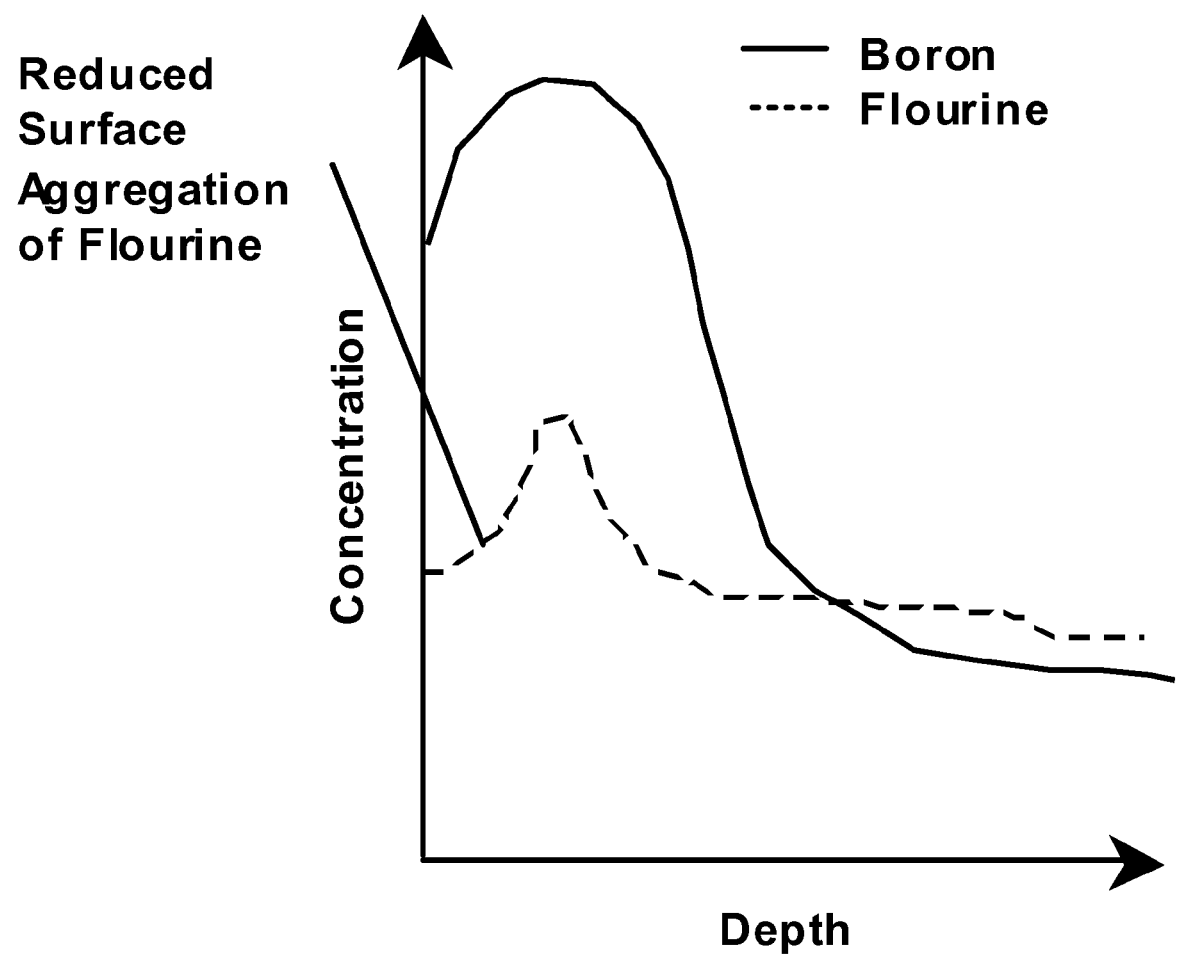
FIG. 5 represents a graph showing ion concentrations after $BF_2$ has been implanted into a substrate using the temperature profile shown in FIG. 4.
Figure 6A:
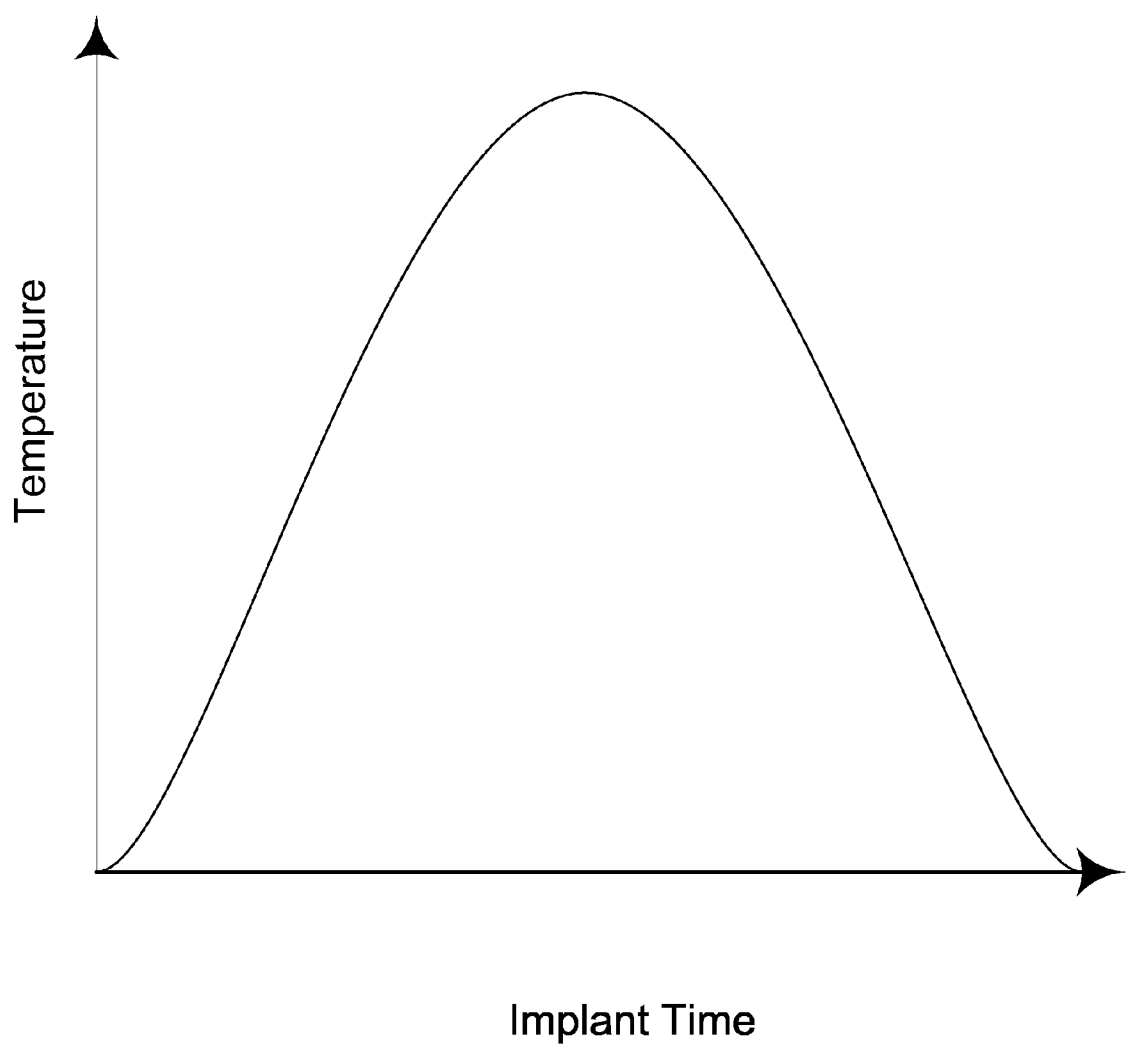
FIGS. 6a-e represent various temperature profiles that can be used according to other embodiments.
Figure 6B:
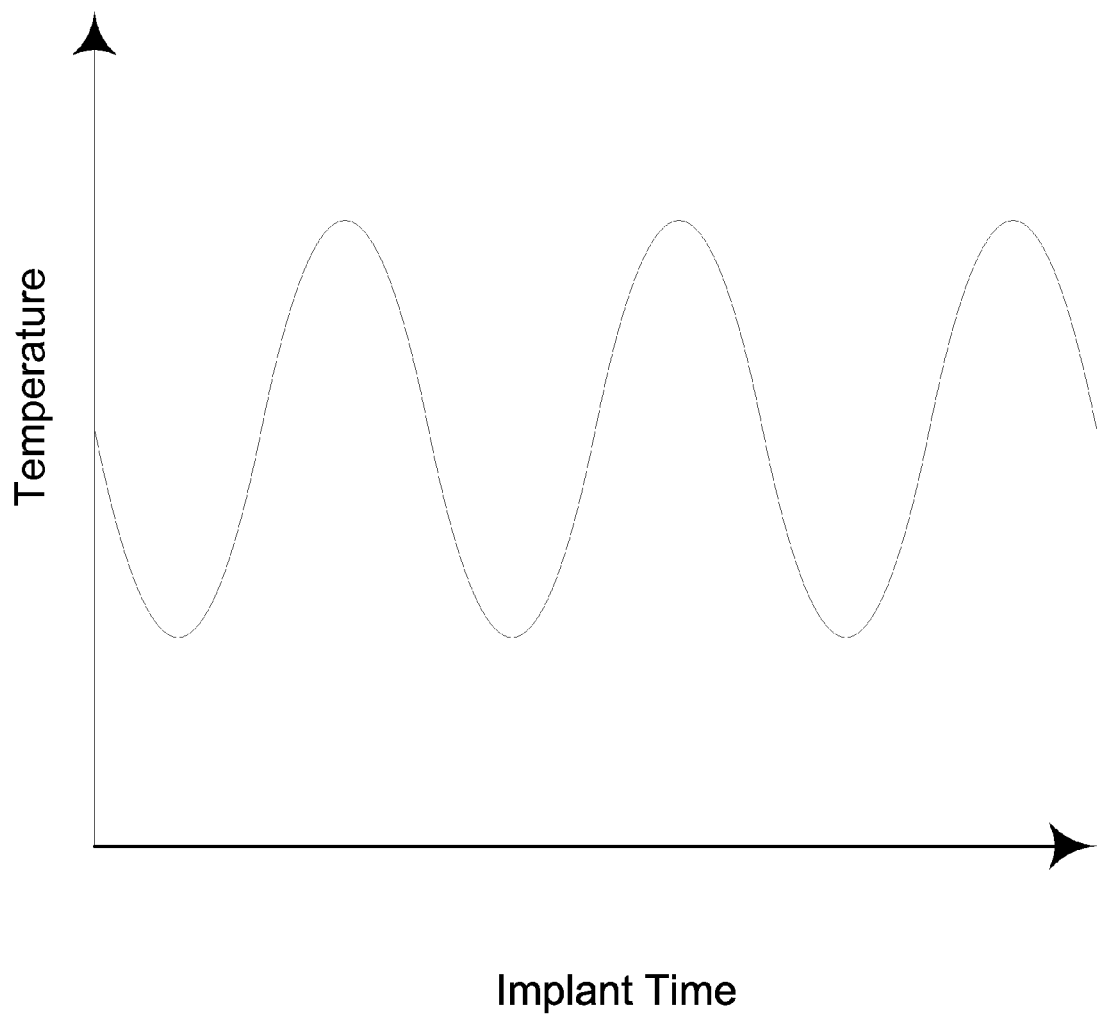
Figure 6C:
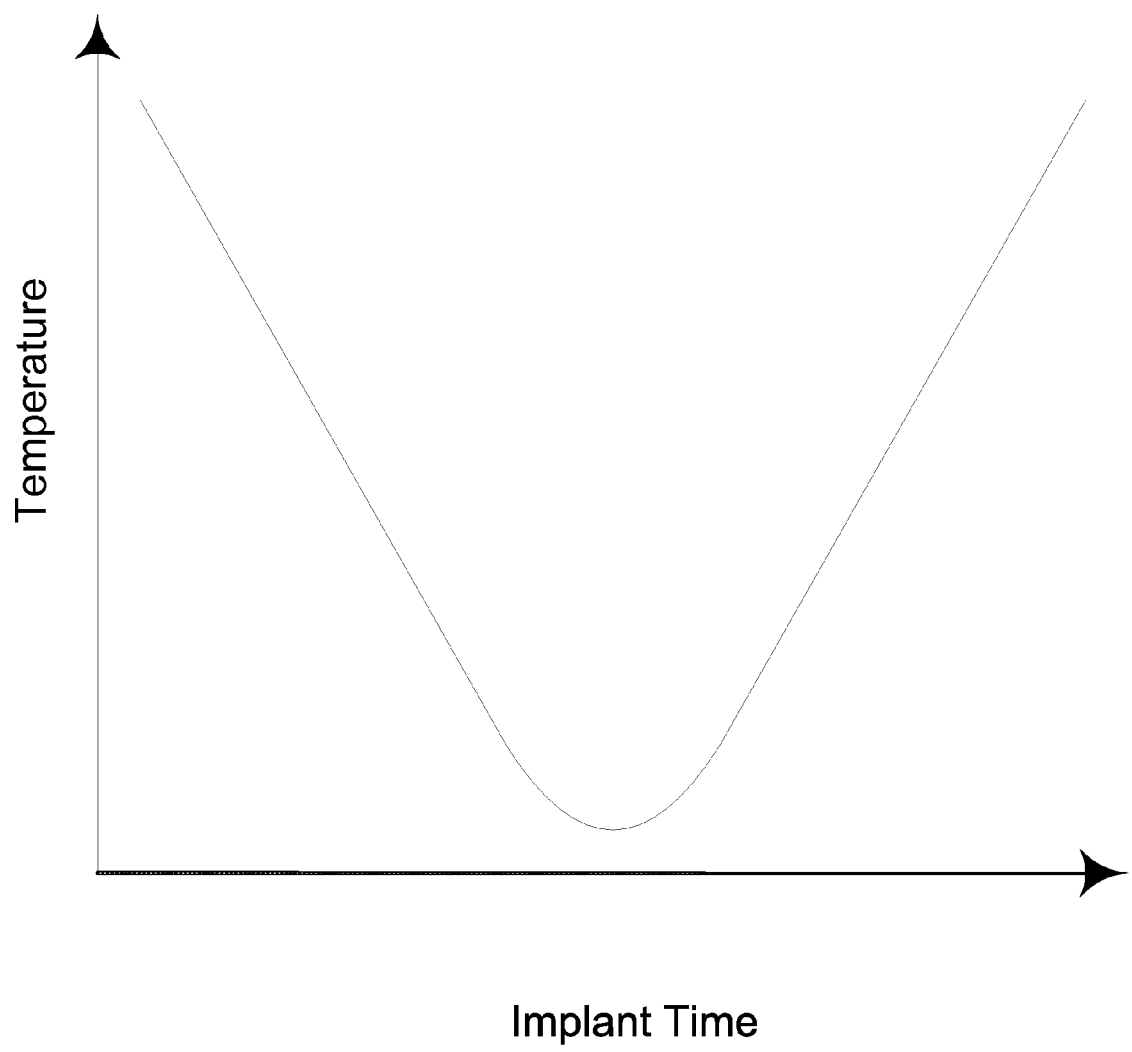
Figure 6D:
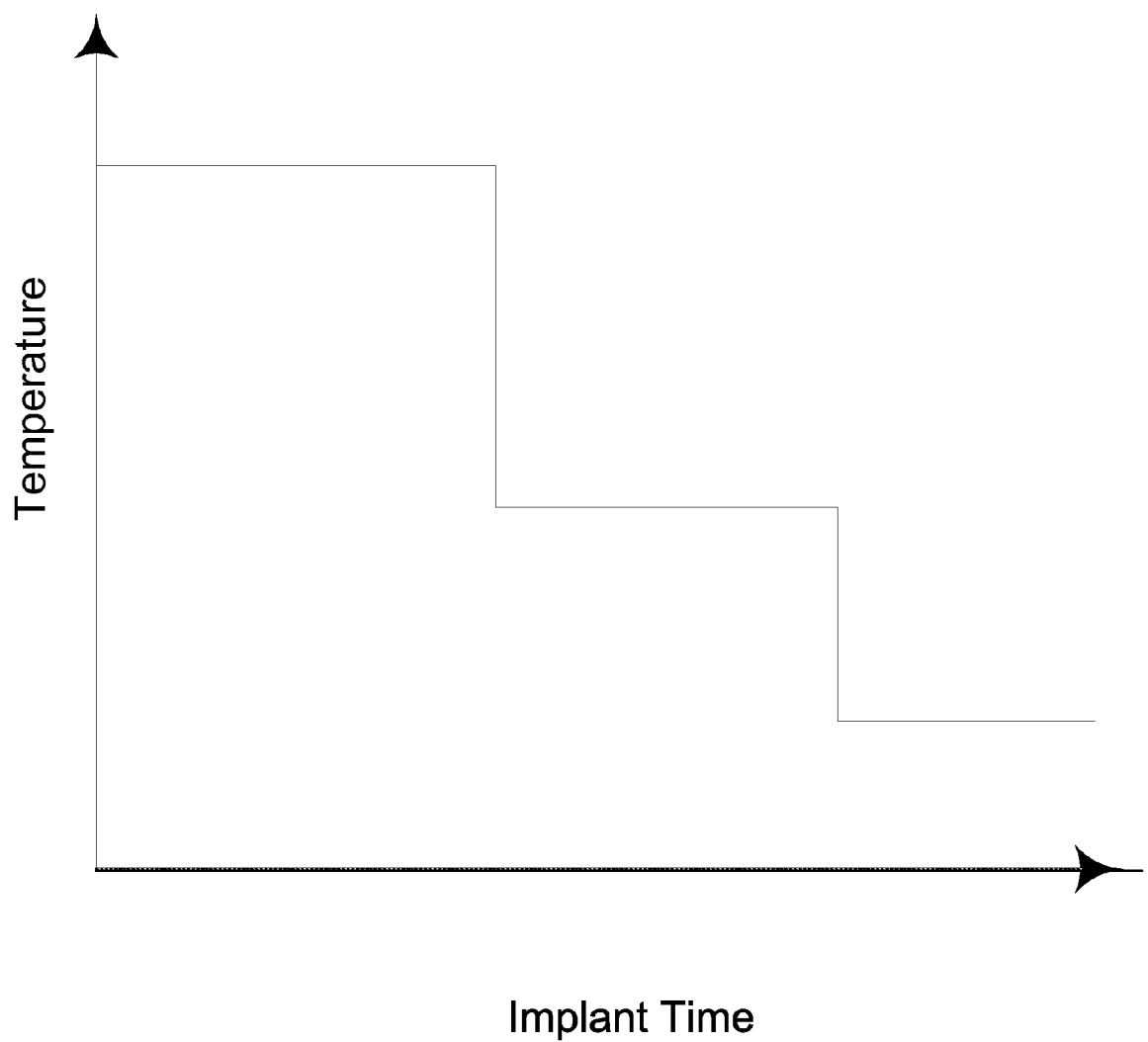
Figure 6E:
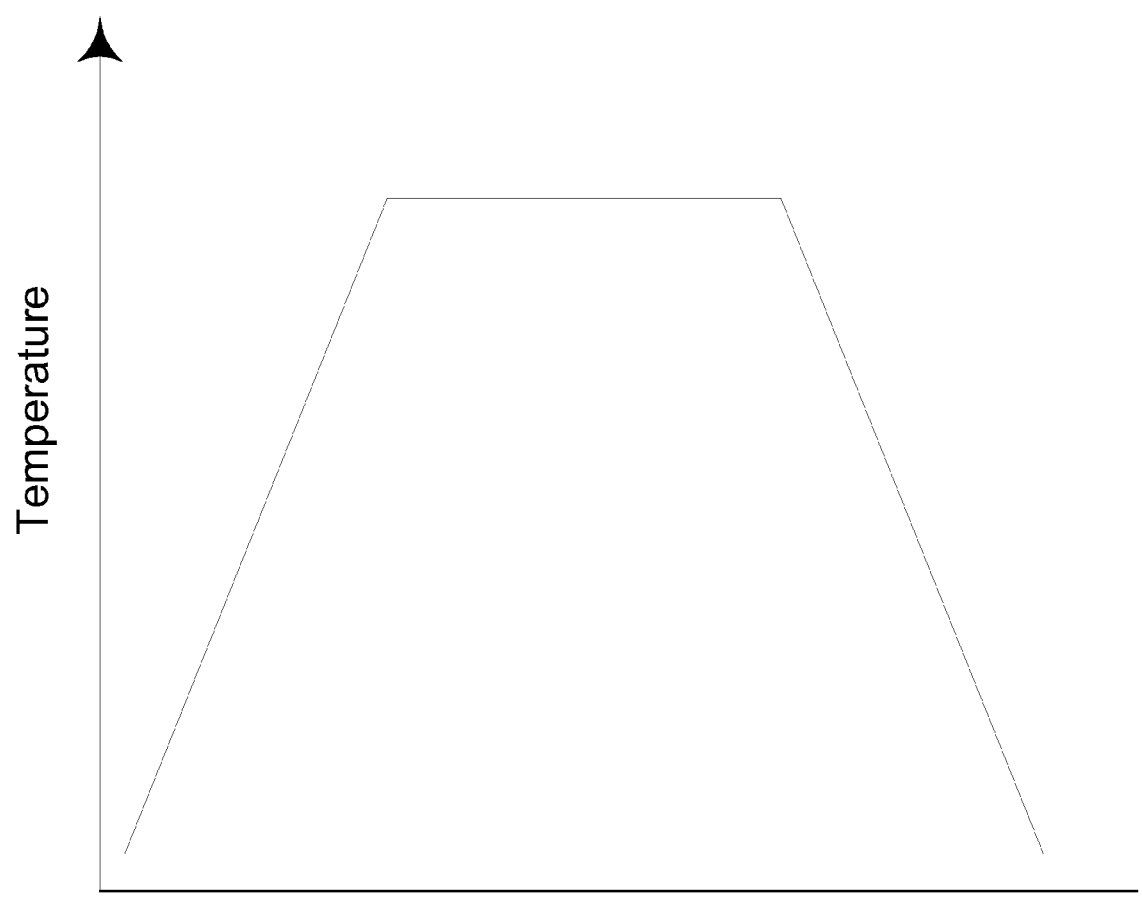

FIG. 5 represents a graph of the concentration of boron and fluorine ions in a substrate implanted using the temperature profile shown in FIG. 4. Again, the boron concentration is minimally affected by the change in temperature. However, the fluorine concentration is significantly altered. At increased depth, the fluorine concentration closely resembles that shown in FIG. 3. However, at shallow depths, near the substrate surface, the fluorine profile is very different, due to the diffusion of fluorine into the ambient environment. Since the rate of diffusion is related to the distance from the substrate surface, the fluorine concentration increases slightly as the depth increases, then decreases again as it follows the profile from FIG. 3. This profile has the advantages of cold temperature implantation (i.e. better amorphization, limited EOR defects) without the drawback of increased surface fluorine concentration.

While FIG. 4 shows a constant ramp between the cold temperature and the hot temperature, the disclosure is not limited to this configuration. For example, the temperature may be ramped during the entire implant process. Alternatively, the change in temperature may be more abrupt (i.e. a greater slope for Line 110), or more gradual (i.e. reduced slope for line 110).

The concept of using a varying temperature profile during ion implantation has additional applications. For example, in another embodiment, hot ion implantation is performed first, followed by a lower temperature implant. This combination is useful if it is desirable to minimize amorphous creation. One example is the doping/implantation of source and drain regions of modern ICs. Modern source and drain regions (S/D) in transistors are grown epitaxially. During the epi-growth, these regions are doped in-situ within the epitaxial process. P-MOSFETS have germanium doped S/D and N-MOSFETS have carbon doped S/D. This is to enable a strain within the doped lattice. This induced strain, which is due to mismatched atom (Si—Ge—C) sizes and bond lengths, exerts a stress in the channels of the transistors. This stress enhances mobility of carriers and hence the performance of transistors. The S/D regions need additional doping to reduce resistivity. During these implants, minimum damage of the Ge- or C-doped S/D region is preferable so as to maintain the stress in those areas. In such a case, an elevated/higher temperature implant is useful as there is very little amorphization of the implanted area. Furthermore, if a portion (towards the tail end of the implant) is performed at cold temperatures, the surface of the substrates is less defective. Cold implants inherently create fewer defects at the surface. This reduces the probability of defect formation during silicide or contact formation during subsequent processing of the ICs. While the above example described the benefits with epitaxially grown silicon, similar benefits are realized with other materials, such as polysilicon, materials with high dielectric constants (HiK materials), metals, and dielectrics.

Other applications requiring varied temperature profiles during ion implantation are also within the scope of the disclosure. For example, temperature profiles, such as those shown in FIGS. 6a-e, can also be used in certain applications. These profiles include step functions, parabolic and inverse parabolic curves, hyperbolic curves, sinusoidal waves and ramp functions.

The temperature modulation described herein can be performed using a plurality of methods. In one embodiment, the ion implantation process is separated into two or more independent implantation processes. For example, the profile shown in FIG. 4 may be achieved by implanting the substrate using conventional cold implantation techniques for a portion of the cycle. The process is then suspended and resumed using conventional hot implantation techniques. This method results in a discontinuous temperature profile, and also added additional time between the two temperature implants.

A second method of modulating the temperature of the substrate is through temperature control of the platen on which the substrate rests. In one embodiment, conduits exist within the platen, which can be used to pass fluids, either gas or liquid, through the platen. Depending on the type of fluid and its temperature, this action can cause the platen to be cooled or heated. For example, during the implant shown in FIG. 4, a refrigerant, such as liquid nitrogen, can be passed through the conduit during the first portion of the implant process. The temperature ramp can be achieved by allowing the heat from implant to warm the substrate and the platen. A second fluid, such as water can then be passed through the platen to maintain its maximum temperature.

A third method involves the use of an external heating device, such as an IR lamp or laser, to increase the temperature of the platen. The heating can also be achieved through a resistive heating device embedded in the platen that when powered heats the platen and hence the wafer substrate. The heating could also be alternatively done using an inductively coupled heating device. In this scenario, the refrigerant is passed through the platen during the first portion of the implant as described above. However, the temperature increase is achieved by enabling a heating device to warm the surface of the substrate. Once the heating device is enabled, the fluid flow through the platen is stopped.

In another embodiment, the heating device and the refrigerant are used concurrently to create the desired temperature gradient. For example, for a steep temperature gradient, the heating device is enabled and the fluid flow through platen is ceased. For a more gradual temperature gradient, the heating device is enabled and the fluid flow through the platen continues at the same or a controlled changing rate.

What is claimed is:

1. A method of minimizing undesired secondary dopants in a substrate during an ion implant process, comprising:

a. Implanting said substrate with molecular ions at a first temperature during a first portion of said process, wherein said molecular ions break into desired primary and undesired secondary dopants upon collision with said substrate; and
b. Increasing the temperature of said substrate during a second portion of said implant process, such that said undesired secondary dopants diffuse through the surface of said substrate.

2. The method of claim 1, wherein said first temperature is less than room temperature.

3. The method of claim 2, wherein said first temperature is between −100° C. and −10° C.

4. The method of claim 1, wherein said temperature is increased above room temperature.

5. The method of claim 4, wherein said temperature is increased to greater than 100° C.

6. A method of implanting ions into a substrate during an implant process, comprising:
   a. implanting a portion of said ions into said substrate at a first temperature; and
   b. implanting a second portion of said ions into said substrate at a second temperature.

7. The method of claim 6, wherein said substrate is selected from the group consisting of epitaxially grown source and drain regions, polysilicon, materials with high dielectric constants (HiK materials), metals, and dielectrics, and said first temperature is greater than said second temperature.

8. The method of claim 7, wherein said first temperature is greater than 100° C.

9. The method of claim 7, wherein said second temperature is between −100° C. and −10° C.

10. The method of claim 6, wherein said ions comprise a molecular ion having desired and undesired secondary dopants, and said first temperature is lower than said second temperature.

11. The method of claim 10, wherein said first temperature is between −100° C. and −10° C.

12. The method of claim 10, wherein said second temperature is greater than 100° C.

13. The method of claim 6, further comprising implanting a third portion of said ions at a third temperature.

14. The method of claim 13, wherein said first and third temperatures are the same.

15. The method of claim 13, wherein said second temperature is the greatest of said three temperatures.

16. The method of claim 13, wherein said second temperature is the least of said three temperatures.

17. A method of implanting ions into a substrate during an implant process, comprising:
    a. Generating a non-constant temperature profile;
    b. implanting a portion of said ions into said substrate at a first temperature; and
    c. implanting a second portion of said ions into said substrate at a second temperature.

18. The method of claim 17, wherein said profile comprises discrete temperature steps.

19. The method of claim 17, wherein said profile comprises a linear ramp.

20. The method of claim 17, wherein said profile comprises a exponential ramp.

21. The method of claim 17, wherein said profile comprises a sinusoid.

* * * * *